United States Patent [19]

Austin et al.

[11] Patent Number: 4,941,941

[45] Date of Patent: Jul. 17, 1990

[54] METHOD OF ANISOTROPICALLY ETCHING SILICON WAFERS AND WAFER ETCHING SOLUTION

[75] Inventors: Larry W. Austin, Hinesburg; Harold G. Linde, Richmond, both of Vt.

[73] Assignee: International Business Machines Corporation, Armonk, N.Y.

[21] Appl. No.: 416,337

[22] Filed: Oct. 3, 1989

[51] Int. Cl.$^5$ .................. H01L 21/306; B44C 1/22; C09K 13/00; C03C 15/00

[52] U.S. Cl. .................. 156/647; 156/628; 156/657; 156/659.1; 156/662; 252/79.1; 252/79.4

[58] Field of Search .................. 156/647, 657, 659.1, 156/662, 628; 252/79.1, 79.2, 79.4, 79.5; 437/225, 228, 233

[56] References Cited

U.S. PATENT DOCUMENTS

| | | | |
|---|---|---|---|
| 3,160,539 | 12/1964 | Hall et al. | 156/17 |
| 3,650,957 | 3/1972 | Shipley, Jr. et al. | 252/79.1 |
| 3,873,203 | 3/1975 | Stevenson . | |
| 4,229,979 | 10/1980 | Greenwood | 73/704 |
| 4,293,373 | 10/1981 | Greenwood | 156/628 |
| 4,342,817 | 8/1982 | Bohlen et al. | 430/5 |
| 4,417,946 | 11/1983 | Bohlen et al. | 156/643 |

OTHER PUBLICATIONS

Hoeg, A. et al., "Metallic Free Organic Aluminum Etchant", IBM Tech. Discl. Bull., vol. 15, No. 1, (Jun. 1972), p. 173.

Bassous, E., "Controlled Anisotropic Etching of Single Crystal Silicon", IBM Tech. Discl. Bull., vol. 19, No. 9, (Feb. 1977), p. 3623.

Barran, E. F. et al., "Anisotropic Etching Solution with High Etch Rate on Single Crystal Silicon", IBM Tech. Discl. Bull., vol. 19, No. 10, (Mar. 1977), p. 3953.

*Primary Examiner*—William A. Powell
*Attorney, Agent, or Firm*—William D. Sabo

[57] ABSTRACT

An improved method for anisotropically etching the (100) crystallographic plane of silicon wafers, involves immersing the wafers in an etching solution containing an aromatic compound having at least two adjacent hydroxyl groups and a polar functional group on the ring, an amine and water. A quality etch at an appreciably greater rate is achieved.

28 Claims, No Drawings

METHOD OF ANISOTROPICALLY ETCHING SILICON WAFERS AND WAFER ETCHING SOLUTION

BACKGROUND OF THE INVENTION

1. Field of the Invention

This invention relates to the etching of silicon, and, more particularly, to the improved anisotropic etching of single crystal silicon.

2. Description of the Prior Art

The anisotropic etching of single crystal silicon has been carried out for many years in the production of microelectronic devices. An essential feature is that the etching solution etch the (100) crystallographic plane at an appreciably greater rate than the (110) and (111) planes, producing v-shaped sidewalls at 54.74° from the (100) surface. Exemplificative of the solutions which are known in the art are the following: IBM Tech. Discl. Bull., Vol. 19, No. 9 (February 1977), p. 3623 discloses a solution for anisotropically etching single crystal silicon, containing ethylene diamine, pyrocatechol and water; and IBM Tech. Discl. Bull., Vol. 19, No. 10 (March 1977), p. 3953 also describes such a solution, containing the three ingredients described in the preceding article, but further including hydrogen peroxide.

See also, U.S. Pat. Nos. 4,417,946, issued to Bohlen et al on Nov. 29, 1983, and 4,342,817, issued to Bohlen et al on Aug. 3, 1982, both of which disclose a method of making a mask, employing an etching solution consisting of ethylene diamine, pyrocatechol, water, and, optionally, hydrogen peroxide; and U.S. Pat. Nos. 4,293,373, issued to Greenwood on Oct. 6, 1981, and 4,229,979, issued to Greenwood on Oct. 28, 1980, both of which disclose a method of making a silicon transducer which involves etching a boron doped silicon wafer, with a solution containing ethylene diamine, pyrocatechol and water.

Note also, U.S. Pat. No. 3,650,957, issued to Shipley, Jr. et al on Mar. 21, 1972, which discloses a solution for etching copper, which includes a source of cupric ions, a complexing agent for cupric ions, such as a hydroxycarboxylic acid or an alkanolamine, a source of chloride or bromide ions and a solution soluble molybdenum, tungsten or vanadium compound.

U.S. Pat. No. 3,873,203, issued to Stevenson on Mar. 25, 1975, discloses a mixture for etching silicon, containing hydrazine and pyrocatechol.

Further, U.S. Pat. No. 3,160,539, issued to Hall et al on Dec. 8, 1964, relates to an etching solution for silicon, which includes piperidine.

IBM Tech. Discl. Bull., Vol. 15, No. 1 (June 1972), p. 173 discloses an etchant for aluminum, consisting of a solution of a secondary organic amine, such as piperidine or pyrrolidine, in water.

In addition, a particularly effective solution for etching single crystal silicon is disclosed in U.S. patent application Ser. No. 875,833, filed by Beechko on June 18, 1986. That solution comprises ethanolamine, pyrocatechol, water, hydrogen peroxide and piperidine. It has been found that the solution etches (100) silicon at a rate of about 40 $\mu$/hr.

BRIEF SUMMARY OF THE INVENTION

Now, an improved method of etching silicon has been developed which involves contacting the silicon with an etching solution which comprises an aromatic compound having at least two adjacent hydroxyl groups and a polar functional group on the ring, an amine and water. The present invention is also directed to the etching solution per se.

In accordance with the invention, an etch rate for (100) silicon of about 125–140 $\mu$/hr. has been achieved. This rate is, for example, more than three times greater than that normally obtained by employing the etching solution of the above-noted Beechko application. Moreoever, the etching solution is relatively safe in manufacturing use and environmentally compatible with current disposal techniques.

DETAILED DESCRIPTION

In the practice of the invention, silicon wafers to be etched are preferably immersed in the etching solution. Preferably, this is carried out at a temperature of about 100°–125° C., more preferably of about 115°–125° C. The actual temperature and time may vary, however, depending upon a number of factors, such as the desired etch rate, the geometry being etched, the exact formulation employed, and so forth, as will be apparent to those skilled in the art. In addition, the pH of the solution preferably ranges from about 11–12 in most situations.

As noted above, the etching solution employed according to the present invention includes an aromatic compound having at least two adjacent hydroxyl groups and a polar functional group on the ring. Typically, the polar functional group is COOH, $SO_2OH$ or $NO_2$, with COOH being preferred. Suitable aromatic compounds include, for example, the following:

1,2-dihydroxybenzene-3,5-disulfonic acid;
6,7-dihydroxy-2-naphthalenesulfonic acid;
3,4-dihydroxybenzoic acid;
2,3-dihydroxybenzoic acid;
2,3,4-trihydroxybenzoic acid;
4-nitrocatechol; and
esculetin (6,7-dihydroxycoumarin).

In a particularly preferred embodiment, the aromatic compound is gallic acid.

Any suitable amine compound with a relatively high polarity may be employed in the etching solution of the invention. Suitable amines include, for example, the following:

a. The primary aliphatic amines including mono-, di-, and triamines. These amines usually contain 2–8, and preferably 2–6, carbon atoms such as ethylamine, n-propylamine, n-butylamine, n-amylamine, n-hexylamine, ethylene diamine, diaminopropane, diaminobutane, pentamethylene diamine, m-xylylenediamine and diethylene triamine. Particularly preferred amines in this group are the diamines having 2–4 carbon atoms such as ethylene diamine and diaminopropane.

b. The alkanolamines, i.e., the aliphatic hydroxy amines. Usually each alkanol group in these amines contains from 2 to 5 carbon atoms. Illustrative are monoethanolamine, diethanolamine, triethanolamine, the mono-, di-, and tripropanolamines, ethanolpropanolamine, diethanolpropanolamine, and the mono-, di-, and tributanolamines. Particularly preferred alkanolamines are those in which each alkanol group contains 2–3 carbon atoms such as the ethanolamines, the propanolamines and the ethanolpropanolamines.

In a particularly preferred embodiment of the invention, monoethanolamine is employed.

Although the proportions of the ingredients may vary over wide ranges, the etching solution preferably contains about 3-6 mole percent of the aromatic compound, about 32-56 mole percent of the amine and about 65-38 mole percent of water. More preferably, the etching solution contains about 4-6 mole percent of the aromatic compound, about 39-56 mole percent of the amine and about 57-38 mole percent of water.

Various other ingredients may be added to the etching solution. For example, a small amount, such as about 0.2-0.3 mole percent, of pyrazine or piperidine or of hydrogen peroxide (e.g., 0.5-3 ml/1000 ml of amine compound) may be added in order to further enhance the etch rate of the solution. In addition, a small amount of a surfactant (e.g., 0.5-3 ml/1000 ml of amine compound), such as "FC-129", commercially available from Minnesota Mining & Manufacturing Company, or other fluorinated hydrocarbon surfactants, may be added. The presence of surfactant is desirable because it provides an increase in uniformity of etching, apparently by inhibiting adhesion of evolving hydrogen bubbles at the etching surface.

The etching solution of the invention provides a quality etch, i.e. with minimal pits, hillocks and faceting, and at a significantly faster rate. As such, it is desirable for use in a number of applications. For example, the etching solution can also be used to etch P-doped silicon wafers in the manner described in U.S. Pat. No. 4,342,817, the entire disclosure of which is incorporated herein by reference.

In one preferred application, the etching solution can be used to etch (100) silicon at a high rate (about 125-140 $\mu$/hr.), while stopping at highly doped boron interfaces, allowing production of large, thin boron-rich windows on the surface of thick silicon wafers. These silicon products are useful in the manufacture of x-ray and e-beam masks.

Besides etching single crystal silicon, the etching solution of the invention is also effective in etching other silicon, such as polycrystalline silicon or epitaxial silicon.

The following examples are provided to illustrate the invention.

EXAMPLE 1

A pyrex reaction vessel (250 mm×200 mm) was charged with 3 liters of monoethanolamine and 600 ml of deionized water. 900 Grams of gallic acid was added through a powder funnel, and the funnel rinsed with an additional 300 ml of deionized water. 20 Grams of pyrazine, 4.5 ml of surfactant ("FC-129") and 7.5 ml of 30% hydrogen peroxide were added, and the amber solution was brought to reflux under a water condenser.

Silicon wafers having a (100) crystallographic orientation were etched by immersing the wafers in the etching solution at a temperature of about 118°-120° C. for about 4 to 4.5 hrs. The etching solution etched (100) silicon at a rate of about 94 $\mu$/hr. See Table I below.

EXAMPLE 2

A pyrex reaction vessel (250 mm×200 mm) was charged with 1400 ml of deionized water, 1150 grams of gallic acid, 25 grams of pyrazine, 3800 ml of monoethanolamine and 7 ml of surfactant ("FC-129") The solution was heated to reflux under a water condenser.

Silicon wafers having a (100) crystallographic orientation were etched by immersing the wafers in the etching solution at a temperature of about 119° C. for about 5.5 hrs. The etching solution etched (100) silicon at a rate of about 125 $\mu$/hr. See Table I below.

EXAMPLE 3

A 500 ml pyrex reaction kettle was charged with 335 ml of monoethanolamine and 75 ml of deionized water. 100.4 Grams of gallic acid was added through a powder funnel. 25 Ml of piperidine, 1 ml of surfactant ("FC-129") and 3 ml of 30% hydrogen peroxide were added, and the amber solution was brought to reflux under a water condenser.

Silicon wafers having a (100) crystallographic orientation were etched by immersing the wafers in the etching solution at a temperature of about 125° C. for about 10 hrs. The etching solution etched (100) silicon at a rate of about 60-70 $\mu$/hr. See Table I below.

COMPARATIVE EXAMPLES A-G

For purposes of comparison, the procedure of Example 3 was repeated using the formulations as shown in Table I. In each Comparative Example, an aromatic compound, other than as defined in the description above was used in the formulation in place of gallic acid. In each case, the etch rate results for (100) silicon were found to be unacceptable. The formulations and the corresponding results are summarized in Table I below.

TABLE I

| | Example | | | Comparative Example | | | | | | |
|---|---|---|---|---|---|---|---|---|---|---|
| | 1 | 2 | 3 | A | B | C | D | E | F | G |
| Formulation | | | | | | | | | | |
| Monoethanolamine | X | X | X | X | X | X | X | X | X | X |
| Piperidine | | | X | X | X | X | X | X | X | X |
| Pyrazine | X | X | | | | | | | | |
| Water | X | X | X | X | X | X | X | X | X | X |
| Surfactant (FC-129) | X | X | X | X | X | X | | | X | X |
| Hydrogen Peroxide | X | | X | X | X | X | | | X | X |
| Gallic Acid | X | X | X | | | | | | | |
| Quinhydrone | | | | | X | | | | | |
| 1,2-Naphthoquinone-4-Sulfonic Acid | | | | | | X | | | | |
| Alizarin | | | | | | | X | | | |
| Quinalizarin | | | | | | | | X | | |
| 2,3-Dihydroxypyridine | | | | | | | | | X | |
| 3,6-Dihydroxypyridazine | | | | | X | | | | | |
| 1,2-Naphthoquinone | | | | | | | | | | X |
| Catechol | | | | | X | | | | | |
| Etch Results* | | | | | | | | | | |
| Etch Rate ($\mu$/hr) | 94 | 125 | 60-70 | S | N | N | N | N | NS | VS |

*The following abbreviations have been used:
S: Slow
N: None
VS: Very Slow
NS: Non-Selective

EXAMPLES 4-8

The procedure of Example 1 was followed by using the same ingredients in the same relative proportions, except that the amount of water in the solution was varied. The results are summarized in Table II below.

TABLE II

| Example | Amount of Water (Mole Percent) | Etch Rate (μ/hr) |
| --- | --- | --- |
| 4 | 41 | 113 |
| 5 | 46 | 133 |
| 6 | 51 | 140 |
| 7 | 53 | 140 |
| 8 | 57 | 137 |

We claim:

1. A method of etching silicon, comprising contacting said silicon with an etching solution which comprises an aromatic compound having at least two adjacent hydroxyl groups and a polar functional group on the ring, an amine and water.

2. The method of claim 1, wherein said polar functional group is COOH.

3. The method of claim 2, wherein said aromatic compound is gallic acid.

4. The method of claim 1, wherein said amine is selected from the group consisting of a diamine having 2-4 carbon atoms and an alkanolamine in which each alkanol group contains 2-3 carbon atoms.

5. The method of claim 4, wherein said amine is monoethanolamine.

6. The method of claim 1, wherein said etching solution further comprises pyrazine or piperidine.

7. The method of claim 1, wherein hydrogen peroxide is added to said etching solution.

8. The method of claim 1, wherein a surfactant is added to said etching solution.

9. The method of claim 1, wherein said etching solution comprises about 4-6 mole percent of said aromatic compound, about 39-56 mole percent of said amine and about 57-38 mole percent of water.

10. The method of claim 1, wherein said etching solution has a temperature of about 115°-125° C. and has a pH of about 11-12.

11. A method of etching a silicon wafer, comprising introducing said wafer into an etching solution which comprises about 4-6 mole percent of an aromatic compound having at least two adjacent hydroxyl groups and a COOH group on the ring, about 39-56 mole percent of an amine selected from the group consisting of a diamine having 2-4 carbon atoms and an alkanolamine in which each alkanol group contains 2-3 carbon atoms and about 57-38 mole percent of water.

12. The method of claim 11, wherein said aromatic compound is gallic acid and said amine is monoethanolamine.

13. The method of claim 12, wherein said etching solution has a temperature of about 115°-125° C. and has a pH of about 11-12.

14. The method of claim 13, wherein said etching solution further comprises pyrazine or piperidine.

15. The method of claim 14, wherein hydrogen peroxide is added to said etching solution.

16. The method of claim 15, wherein a surfactant is added to said etching solution.

17. An etching solution for silicon, comprising an aromatic compound having at least two adjacent hydroxyl groups and a polar functional group on the ring, an amine and water.

18. The etching solution of claim 17, wherein said polar functional group is COOH.

19. The etching solution of claim 18, wherein said aromatic compound is gallic acid.

20. The etching solution of claim 17, wherein said amine is selected from the group consisting of a diamine having 2-4 carbon atoms and an alkanolamine in which each alkanol group contains 2-3 carbon atoms.

21. The etching solution of claim 20, wherein said amine is monoethanolamine.

22. The etching solution of claim 17, further comprising pyrazine or piperidine.

23. The etching solution of claim 17, further comprising a surfactant.

24. The etching solution of claim 17, comprising about 4-6 mole percent of said aromatic compound, about 39-56 mole percent of said amine and about 57-38 mole percent of water.

25. An etching solution for silicon, comprising about 4-6 mole percent of an aromatic compound having at least two adjacent hydroxyl groups and a COOH group on the ring, about 39-56 mole percent of an amine selected from the group consisting of a diamine having 2-4 carbon atoms and an alkanolamine in which each alkanol group contains 2-3 carbon atoms and about 57-38 mole percent of water.

26. The etching solution of claim 25, wherein said aromatic compound is gallic acid and said amine is monoethanolamine.

27. The etching solution of claim 26, further comprising pyrazine or piperidine.

28. The etching solution of claim 27, further comprising a surfactant.

* * * * *